(12) United States Patent
Standiford et al.

(10) Patent No.: US 9,040,942 B1
(45) Date of Patent: May 26, 2015

(54) ELECTRON BEAM LITHOGRAPHY WITH LINEAR COLUMN ARRAY AND ROTARY STAGE

(75) Inventors: Keith Standiford, Carmel, CA (US); Alan D. Brodie, Palo Alto, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 680 days.

(21) Appl. No.: 12/008,517

(22) Filed: Jan. 11, 2008

(51) Int. Cl.
*G21K 5/04* (2006.01)
*H01J 37/04* (2006.01)

(52) U.S. Cl.
CPC ...................... *H01J 37/04* (2013.01)

(58) Field of Classification Search
USPC ........... 250/396 R, 397, 398, 396 ML, 492.1, 250/492.2, 492.21, 492.22, 492.23, 492.3; 430/296, 297, 298
See application file for complete search history.

(56) References Cited

U.S. PATENT DOCUMENTS

| | | | |
|---|---|---|---|
| 5,136,169 A | 8/1992 | Smith et al. | |
| 5,434,424 A | 7/1995 | Stickel et al. | |
| 6,177,218 B1 | 1/2001 | Felker et al. | |
| 6,207,965 B1 | 3/2001 | Koike | |
| 6,235,450 B1 | 5/2001 | Nakasuji | |
| 6,291,119 B2 | 9/2001 | Choi et al. | |
| 6,333,508 B1 | 12/2001 | Katsap et al. | |
| 6,414,313 B1 | 7/2002 | Gordon et al. | |
| 6,429,443 B1 | 8/2002 | Mankos et al. | |
| 6,511,048 B1 | 1/2003 | Sohda et al. | |
| 6,525,328 B1 | 2/2003 | Miyoshi et al. | |
| 6,573,516 B2 | 6/2003 | Kawakami | |
| 6,586,733 B1 | 7/2003 | Veneklasen et al. | |
| 6,605,811 B2 | 8/2003 | Hotta et al. | |
| 6,610,890 B1 | 8/2003 | Garcia de Quesada Fort et al. | |
| 6,657,211 B2 | 12/2003 | Benner | |
| 6,674,086 B2 | 1/2004 | Kamada | |
| 6,870,172 B1 | 3/2005 | Mankos et al. | |
| 2003/0122087 A1* | 7/2003 | Muraki et al. | 250/492.2 |
| 2004/0169147 A1* | 9/2004 | Ono et al. | 250/396 R |
| 2007/0080291 A1* | 4/2007 | Buijsse et al. | 250/311 |
| 2008/0128634 A1* | 6/2008 | Tromp | 250/396 ML |
| 2008/0142733 A1* | 6/2008 | Zywno et al. | 250/491.1 |

* cited by examiner

*Primary Examiner* — Nicole Ippolito
(74) *Attorney, Agent, or Firm* — Okamoto & Benedicto LLP

(57) ABSTRACT

One embodiment relates to an apparatus for electron beam lithography which includes a linear array of reflection electron beam lithography columns and a rotary stage. Each column is separately controllable to write a portion of a lithographic pattern onto a substrate. The rotary stage is configured to hold multiple substrates and to be rotated under the linear array of reflection electron beam lithography columns. Another embodiment relates to a method of electron beam lithography which includes simultaneously rotating and linearly translating a stage holding a plurality of wafers, and writing a lithography pattern using a linear array of reflection electron beam lithography columns over the stage. Each said column traverses a spiral path over the stage as the stage is rotated and linearly translated. Other embodiments, aspects and feature are also disclosed.

11 Claims, 11 Drawing Sheets

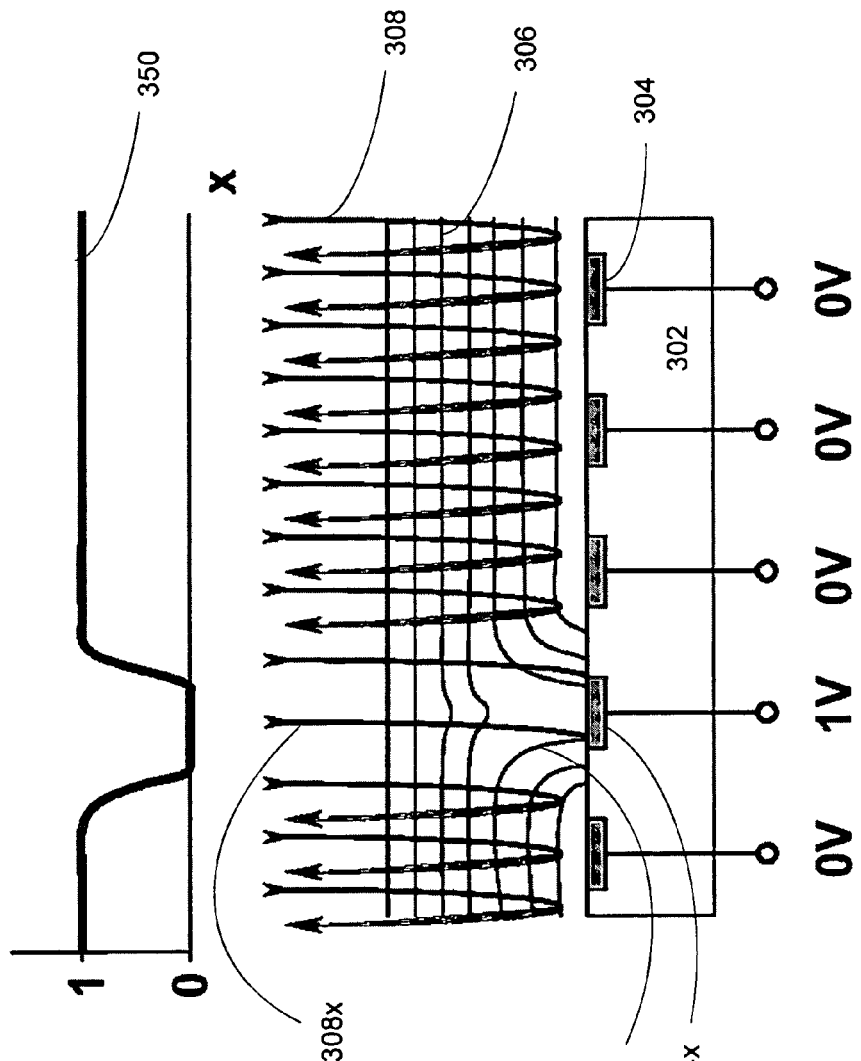

(Single column, y-z view)

(Single column, x-z view)

(Multiple Column Array, x-z view)

ELECTRON BEAM LITHOGRAPHY WITH LINEAR COLUMN ARRAY AND ROTARY STAGE

STATEMENT REGARDING FEDERALLY SPONSORED RESEARCH OR DEVELOPMENT

This invention was made with Government support under Agreement No. HR0011-06-3-0008 awarded by DARPA. The Government has certain rights in the invention.

BACKGROUND

1. Technical Field

The present invention relates generally to semiconductor manufacturing and related technologies. More particularly, the present invention relates to electron beam lithography.

2. Description of the Background Art

As is well-understood in the art, a lithographic process includes the patterned exposure of a resist so that portions of the resist can be selectively removed to expose underlying areas for selective processing such as by etching, material deposition, implantation and the like. Traditional lithographic processes utilize electromagnetic energy in the form of ultraviolet light for selective exposure of the resist. As an alternative to electromagnetic energy (including x-rays), charged particle beams have been used for high resolution lithographic resist exposure. In particular, electron beams have been used since the low mass of electrons allows relatively accurate control of an electron beam at relatively low power and relatively high speed. Electron beam lithographic systems may be categorized as electron-beam direct write (EBDW) lithography systems and electron beam projection lithography systems.

In EBDW lithography, the substrate is sequentially exposed by means of a focused electron beam, wherein the beam either scans in the form of lines over the whole specimen and the desired structure is written on the object by corresponding blanking of the beam, or, as in a vector scan method, the focused electron beam is guided over the regions to be exposed. The beam spot may be shaped by a diaphragm. EBDW is distinguished by high flexibility, since the circuit geometries are stored in the computer and can be optionally varied. Furthermore, very high resolutions can be attained by electron beam writing, since electron foci with small diameters may be attained with electron-optical imaging systems. However, it is disadvantageous that the process is very time-consuming, due to the sequential, point-wise writing. EBDW is therefore at present mainly used for the production of the masks required in projection lithography.

In electron beam projection lithography, analogously to optical lithography, a larger portion of a mask is illuminated simultaneously and is imaged on a reduced scale on a wafer by means of projection optics. Since a whole field is imaged simultaneously in electron beam projection lithography, the attainable throughputs can be markedly higher in comparison with electron beam writers. Disadvantages of conventional electron beam projection lithography systems includes that a corresponding mask is necessary for each structure to be exposed. The preparation of customer-specific circuits in small numbers is not economic, because of the high costs associated with mask production.

BRIEF DESCRIPTION OF THE DRAWINGS

FIGS. 3A and 3B are diagrams illustrating the operation of a dynamic pattern generator in accordance with an embodiment of the invention.

SUMMARY

Figure 1:
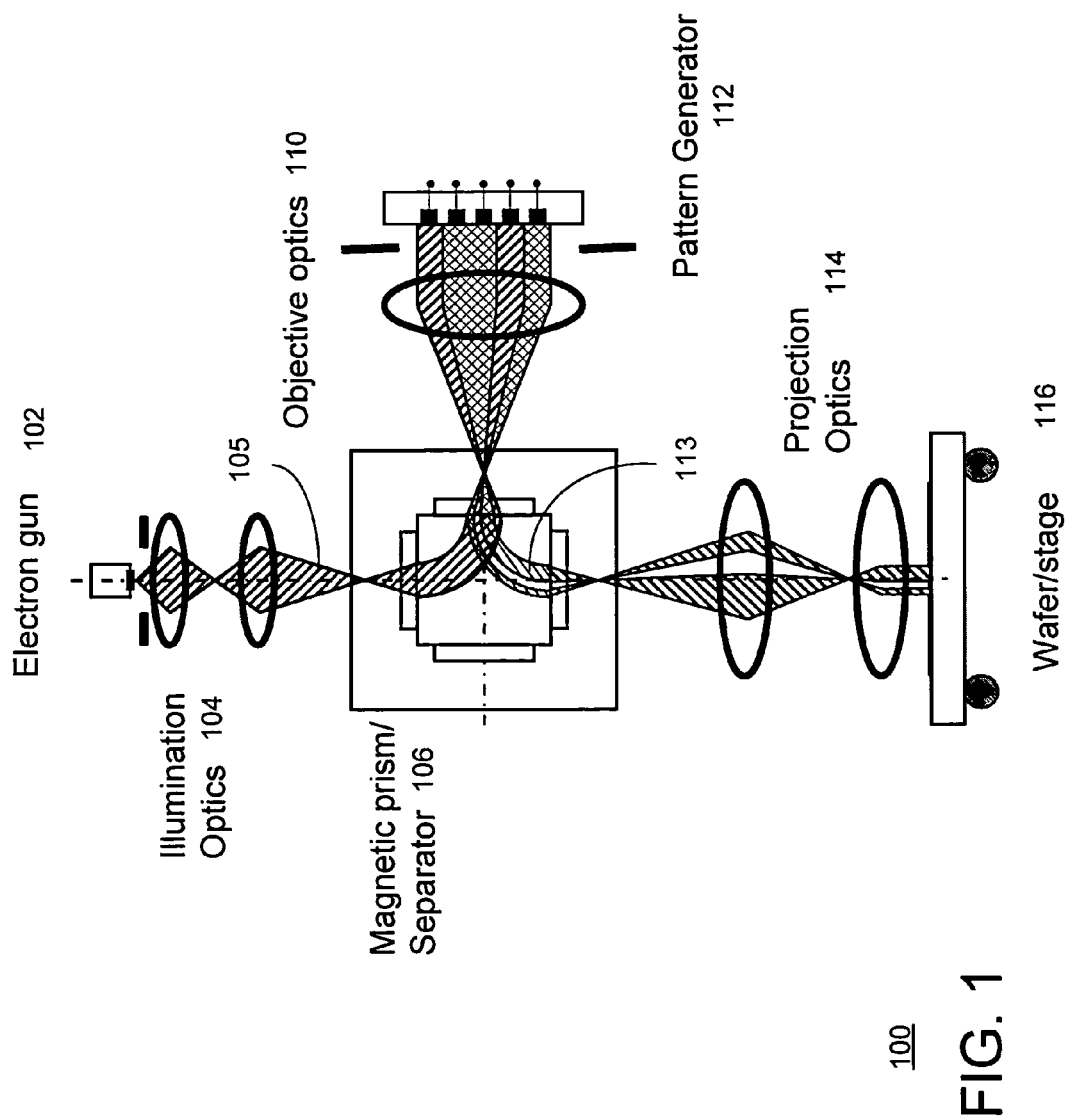
FIG. 1 is a schematic diagram of a single maskless reflection electron beam projection lithography column in accordance with an embodiment of the invention.

One embodiment relates to an apparatus for electron beam lithography which includes a linear array of reflection electron beam lithography columns and a rotary stage. Each column is separately controllable to write a portion of a lithographic pattern onto a substrate. The rotary stage is configured to hold multiple substrates and to be rotated under the linear array of reflection electron beam lithography columns.

Another embodiment relates to a method of electron beam lithography which includes simultaneously rotating and linearly translating a stage holding a plurality of wafers, and writing a lithography pattern using a linear array of reflection electron beam lithography columns over the stage. Each said column traverses a spiral path over the stage as the stage is rotated and linearly translated.

Other embodiments, aspects and feature are also disclosed.

DETAILED DESCRIPTION

Maskless Reflection Electron Beam Lithography

As discussed above, electron-beam direct write (EBDW) lithography has the potential to achieve excellent resolution. However, EBDW has a traditional problem relating to its low throughput. For example, it may take ten to one hundred hours to inscribe an entire wafer using EBDW lithography. One previous approach to attempt to increase the throughput is by increasing the beam current. However, when the current density exceeds a certain threshold, electron-electron interactions cause the beam to blur.

This patent application relates to a system and method of electron beam lithography that overcomes the above-discussed disadvantages and problems. Rather than focusing the electron beam into a tiny spot, the approach described herein floods the wafer with the electron beam. This enables use of a high beam current while keeping the beam current density at a level consistent with minimal electron-electron interactions. For example, an area roughly 0.1 millimeters (mm) wide may be illuminated. That area is several orders of magnitude larger than a traditional EBDW system that focuses the beam into a much smaller spot, for example, with a spot size on the order of tens of nanometers (nm) wide.

A flood beam 0.1 mm wide would normally not provide a writing resolution sufficiently high for practical use in integrated circuit manufacturing. However, the system and method disclosed herein enables high-resolution writing by partitioning the flood beam into a multitude (for example, four million) of independently controllable beams.

While others have tried building multiple columns with multiple sources to achieve multiple beams, there are various difficulties in that approach, including the difficulty of making the multiple columns behave uniformly. The system and method disclosed herein may be implemented using a single column and a single source.

A conventional multi-beam system would require a large array of blankers to achieve a multitude of controllable beams from a single column, each blanker being a small and independently controllable element that can be switched on and off rapidly. However, it is quite problematic to build and control such a large array. For example, a blanker array for a conventional multi-beam system is not normally buildable using integrated circuits because such integrated circuits are opaque to electrons.

The system and method disclosed herein re-directs the beam out of the direct line of sight between the electron source and the semiconductor wafer. Independently-controllable voltages are applied to cells of a dynamic pattern generator array that may be implemented using integrated circuit technology. The voltages determine whether each cell reflects electrons onto the wafer or absorbs electrons (preventing them from being reflected onto the wafer).

The system and method disclosed herein advantageously breaks through the traditional EBDW speed-versus-resolution tradeoff by illuminating a large area and simultaneously exposing a multitude of pixels on the wafer. For example, four million pixels may be exposed using a 4000×1000 array of individually addressable elements. This may be achieved using a single column and a conventional electron source.

FIG. 1 is a schematic diagram of a single maskless reflection electron beam projection lithography column 100 in accordance with an embodiment of the invention. The name may be abbreviated to a reflection electron beam lithography or REBL system. As depicted, the column 100 includes an electron source 102, illumination electron-optics 104, a magnetic prism 106, an objective electron lens 110, a dynamic pattern generator (DPG) 112, projection electron-optics 114, and a stage 116 for holding a wafer or other target to be lithographically patterned. In accordance with an embodiment of the invention, the various components of the column 100 may be implemented as follows.

The electron source 102 may be implemented so as to have a low energy spread. The REBL system 100 should preferably control the energy of the electrons so that their turning points (the distance above the DPG 112 at which they reflect) are relatively constant, for example, to within about 100 nanometers. In accordance with one embodiment of the invention, the source 102 comprises a tungsten Schottky emitter that is operated a few hundred degrees C. below its normal operating temperature to reduce the energy spread of the emitted electrons.

The illumination electron-optics 104 is configured to receive and collimate the electron beam from the source 102. The illumination optics 104 allows the setting of the current illuminating the pattern generator structure 112 and therefore determines the electron dose used to expose the substrate. The illumination optics 104 may comprise an arrangement of magnetic and/or electrostatic lenses configured to focus the electrons from the source 102 so as to generate an incident electron beam 105. The specific details of the arrangement of lenses depend on specific parameters of the apparatus and may be determined by one of skill in the pertinent art.

The magnetic prism 106 is configured to receive the incident beam 105 from the illumination optics 104. When the incident beam traverses the magnetic fields of the prism, a force proportional to the magnetic field strength acts on the electrons in a direction perpendicular to their trajectory (i.e. perpendicular to their velocity vectors). In particular, the trajectory of the incident beam 105 is bent towards the objective lens 110 and the dynamic pattern generator 112. In a preferred embodiment, the magnetic prism 106 is configured with a non-uniform magnetic field so as to provide stigmatic focusing, for example, as disclosed in U.S. patent application Ser. No. 10/775,646, entitled "Improved Prism Array for Electron Beam Inspection and Defect Review," filed Feb. 10, 2004 by inventor Marian Mankos, the disclosure of which is hereby incorporated by reference in its entirety. A uniform magnetic field provides astigmatic focusing wherein focusing occurs in only one direction (for example, so as to image a point as a line). In contrast, the magnetic prism 106 configuration should focus in both directions (so as to image a point as a point) because the prism 106 is also utilized for imaging. The stigmatic focusing of the prism 106 may be implemented by dividing it into smaller sub-regions with different but uniform magnetic fields. Furthermore, the lens elements in the prism 106 may be of a relatively longer length and width so as to provide for a low distortion image over a large field size. However, increasing the length of the prism 106 involves a trade-off of more electron-electron interactions causing more blur. Hence, the reduced image distortion should be balanced against the increased blur when increasing the prism length.

Below the magnetic prism 106, the electron-optical components of the objective optics are common to the illumination and projection subsystems. The objective optics may be configured to include the objective lens 110 and one or more transfer lenses (not shown). The objective optics receives the incident beam from the prism 106 and decelerates and focuses the incident electrons as they approach the DPG 112. The objective optics is preferably configured (in cooperation with the gun 102, illumination optics 104, and prism 106) as an immersion cathode lens and is utilized to deliver an effectively uniform current density (i.e. a relatively homogeneous flood beam) over a large area in a plane above the surface of the DPG 112.

The dynamic pattern generator 112 comprises an array of pixels. Each pixel may comprise a metal contact to which a voltage level is controllably applied. The principle of operation of the DPG 112 is described further below in relation to FIGS. 3A and 3B.

The extraction part the of the objective lens 110 provides an extraction field in front of the DPG 112. As the reflected electrons 113 leave the DPG 112, the objective optics is configured to accelerate the reflected electrons 113 toward their second pass through the prism 106. The prism 106 is configured to receive the reflected electrons 113 from the transfer lens 108 and to bend the trajectories of the reflected electrons towards the projection optics 114.

The projection electron-optics 114 reside between the prism 106 and the wafer stage 116. The projection optics 114 is configured to focus the electron beam and demagnify the beam onto photoresist on a wafer or onto another target.

The wafer stage 116 holds the target wafer. In accordance with an embodiment of the invention, the wafer stage 116 may advantageously comprise a rotating wafer stage as described further below in relation to the examples shown in FIGS. 4A and 4B.

Figure 2:
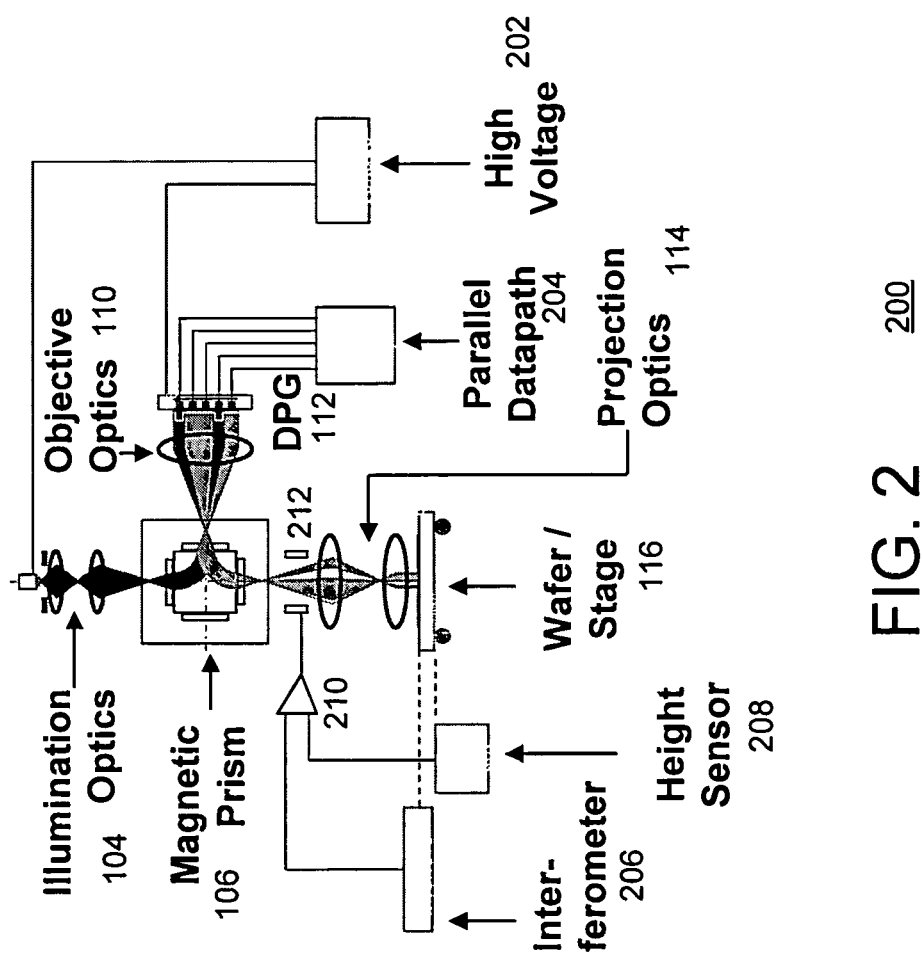
FIG. 2 is a schematic diagram of a system, including a maskless reflection electron beam projection lithography column, which shows further system components in accordance with an embodiment of the invention.

FIG. 2 is a schematic diagram of a system 200, including a maskless reflection electron beam projection lithography column, which shows further system components in accordance with an embodiment of the invention. The additional components illustrated include a high voltage source 202, a parallel datapath 204, an interferometer 206, a height sensor 208, feedback circuitry 210, and beam deflectors 212.

The high voltage source 202 is shown as providing a high voltage to the source 102 and to the DPG 112. The voltage provided may be, for example, 50 kilovolts. The parallel data path 204 is configured to carry control signals to the DPG 112 for controlling the voltage on each pixel (so that it either absorbs electrons or reflects them).

The interferometer 206 may be included to provide tight coupling and positional feedback between the electron beam location and the target on the wafer. In one embodiment, the optical beams are reflected off mirrors on the stage. The resulting interference pattern depends on the difference of the individual beam paths and allows accurate measurement of the stage and wafer position. Optical beams from the interferometer are diffracted from a grating on the target substrate surface, the resultant interference pattern is sensitive to the phase of the grating and can therefore deliver lateral positional information. Vertical positional information may be provided by a height sensor 208. The positional information may be fed back via feedback circuitry 210 so as to control beam deflectors 212. The deflectors 212 are configured to deflect the projected beam so as to compensate for vibrations and positional drift of the wafer.

FIGS. 3A and 3B are diagrams illustrating the operation of a dynamic pattern generator in accordance with an embodiment of the invention. FIG. 3A shows a cross-section of a DPG substrate 302 showing a column (or row) of pixels. Each pixel includes a conductive area 304. A controlled voltage level is applied to each pixel. In the example illustrated in FIG. 3A, four of the pixels are "off" and have zero (0) volts applied thereto, while one pixel (with conductive area labeled 304$x$) is "on" and has one (1) volt applied thereto. (The specific voltages may vary depending on the parameters of the system.) The resultant local electrostatic equipotential lines 306 are shown, with distortions 306$x$ relating to "off" pixel shown. In this example, the incident electrons 308 approaching the DPG 112 come to a halt in front of and are reflected by each of the "on" pixels, but the incident electrons 308$x$ are drawn into and absorbed by the "off" pixel. The resultant reflected current (in arbitrary units) is shown in FIG. 3B. As seen from FIG. 3B, the reflected current is "0" for the "off" pixel and "1" for the "on" pixels.

Data-Rate and Space-Charge Limitations

Two challenges for electron beam lithography are a high data rate requirement and space-charge effects. Data rates on the order of tens of terabits per second may be required. To achieve this high data rate, a parallel approach may be used, such as the REBL approach discussed above. However, the REBL approach described above uses a single electron-beam column apparatus. Therefore, the exposure current is limited because of beam blur associated with space-charge effects.

Linear Array of Columns and Rotary Stage

The present application discloses an approach which uses multiple electron-beam columns. More particularly, this approach arranges the multiple electron-beam columns in a linear array and uses the linear column array in combination with a rotary stage. This combination may be implemented by positioning the array of multiple columns along a diameter of the rotating stage, as depicted in the examples of FIGS. 4A and 4B, for example.

Figure 4A:
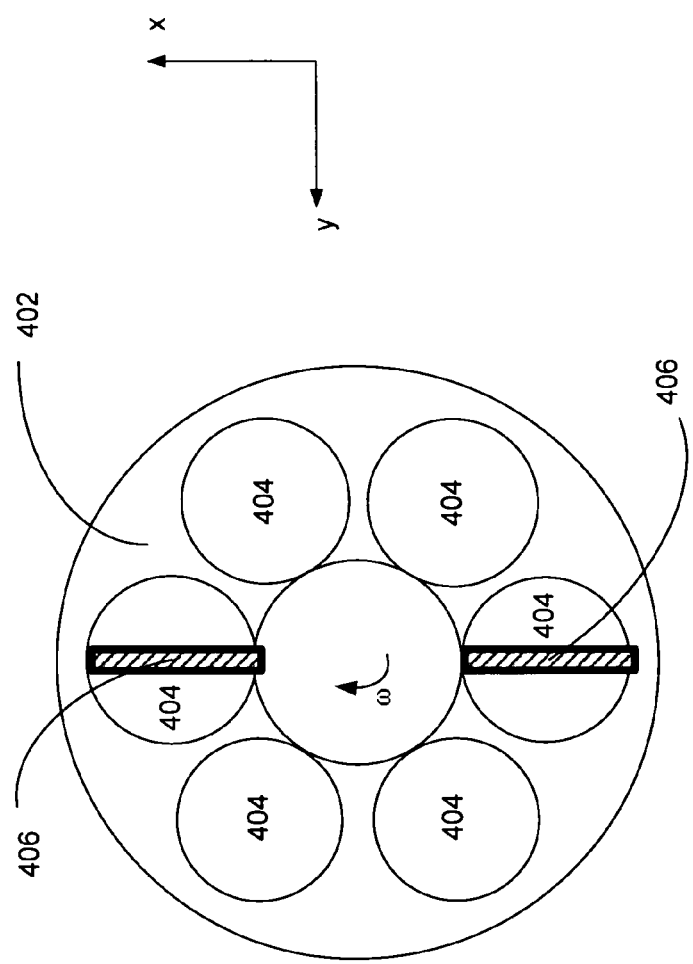
FIGS. 4A and 4B are schematic diagrams of example rotating wafer stages in accordance with embodiments of the invention.
Figure 4B:
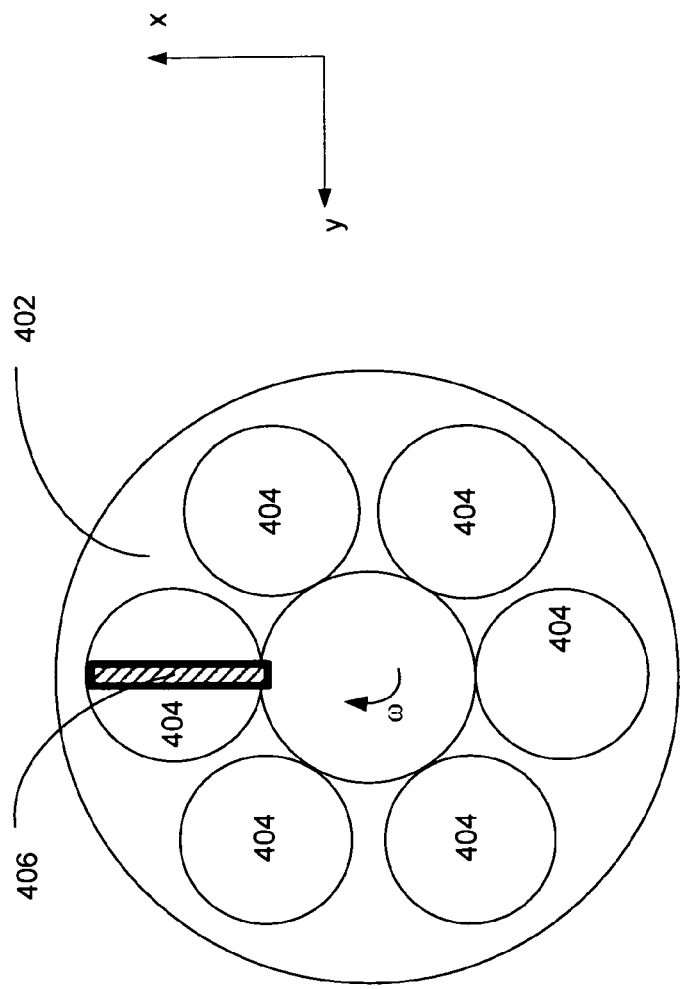

FIG. 4A is a schematic diagram of a rotating wafer stage 116 with two multi-column arrays 406 configured above it in accordance with an embodiment of the invention. Here, an x-y view of the stage is shown, where the z-direction (perpendicular to the x and y directions, i.e. the z-direction is perpendicular to the page) is along the direction of incidence of the electron beam from a REBL column.

In this example, the stage 116 includes a rotatable platen 402 which is configured to hold six semiconductor wafers 404. Of course, other numbers of wafers may be held in other implementations. The direction of rotation of the platen is as shown by the ω direction depicted in the figure, for example.

As depicted in FIG. 4A, there may be one or more linear column arrays 406 configured over the stage 116. In this example, there are two linear column arrays 406 arranged along the x-direction. With these two linear column arrays 406, the rotatable platen 402 would have to be rotated only 180 degrees in order to pattern all the wafers.

In another embodiment, with a single linear column array 406 configured above the stage 116, as shown in the example of FIG. 4B, the rotatable platen 402 would have to be rotated 360 degrees in order to pattern all the wafers. More generally, with N linear column arrays 406 configured with even angular spacing above the stage 116, the rotatable platen 402 would have to be rotated 360/N degrees in order to pattern all the wafers.

Figure 5A:
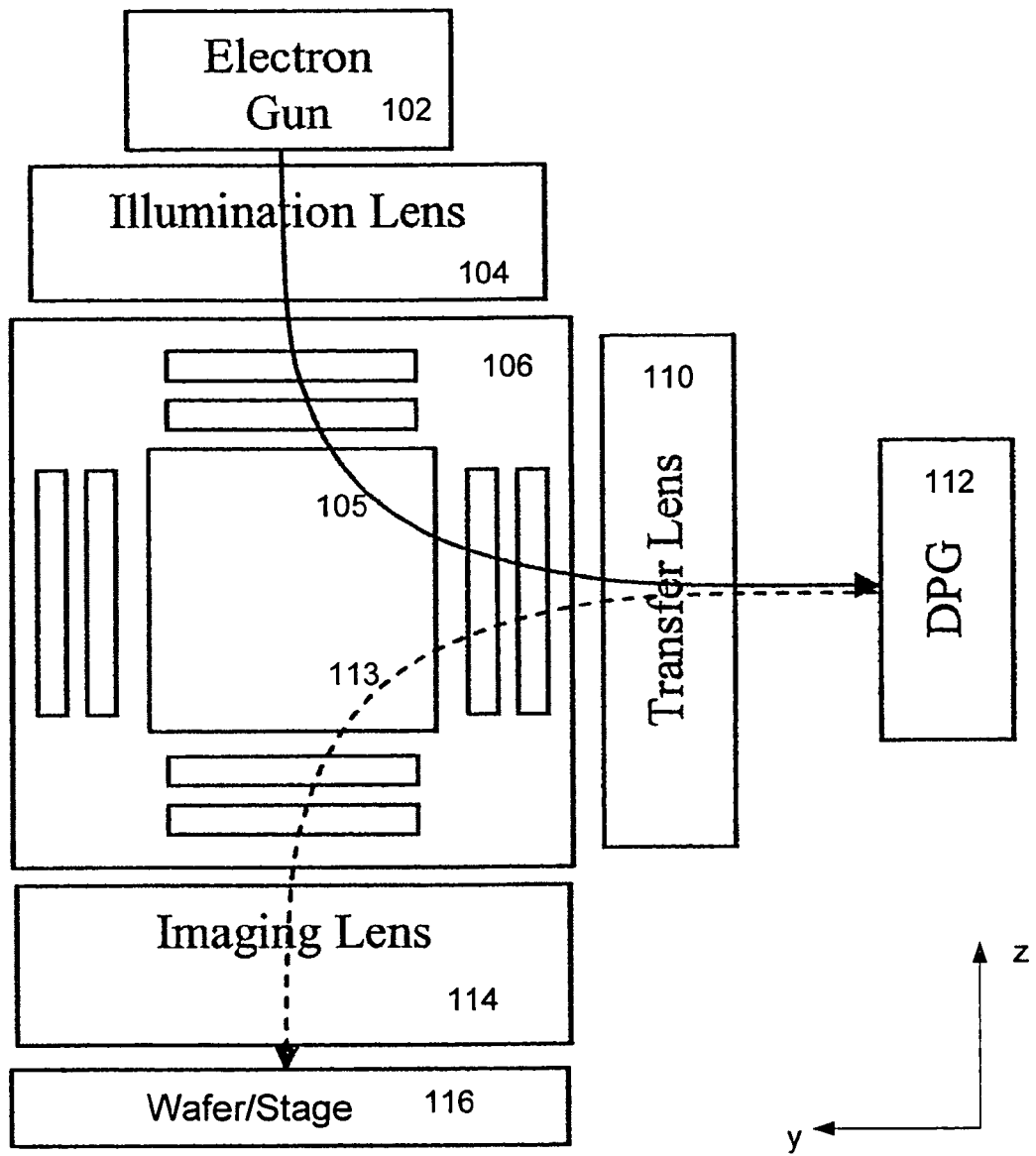
FIGS. 5A and 5B are schematic diagrams (y-z view and x-z view, respectively) of a single maskless reflection electron beam lithography column in accordance with an embodiment of the invention.
Figure 5B:
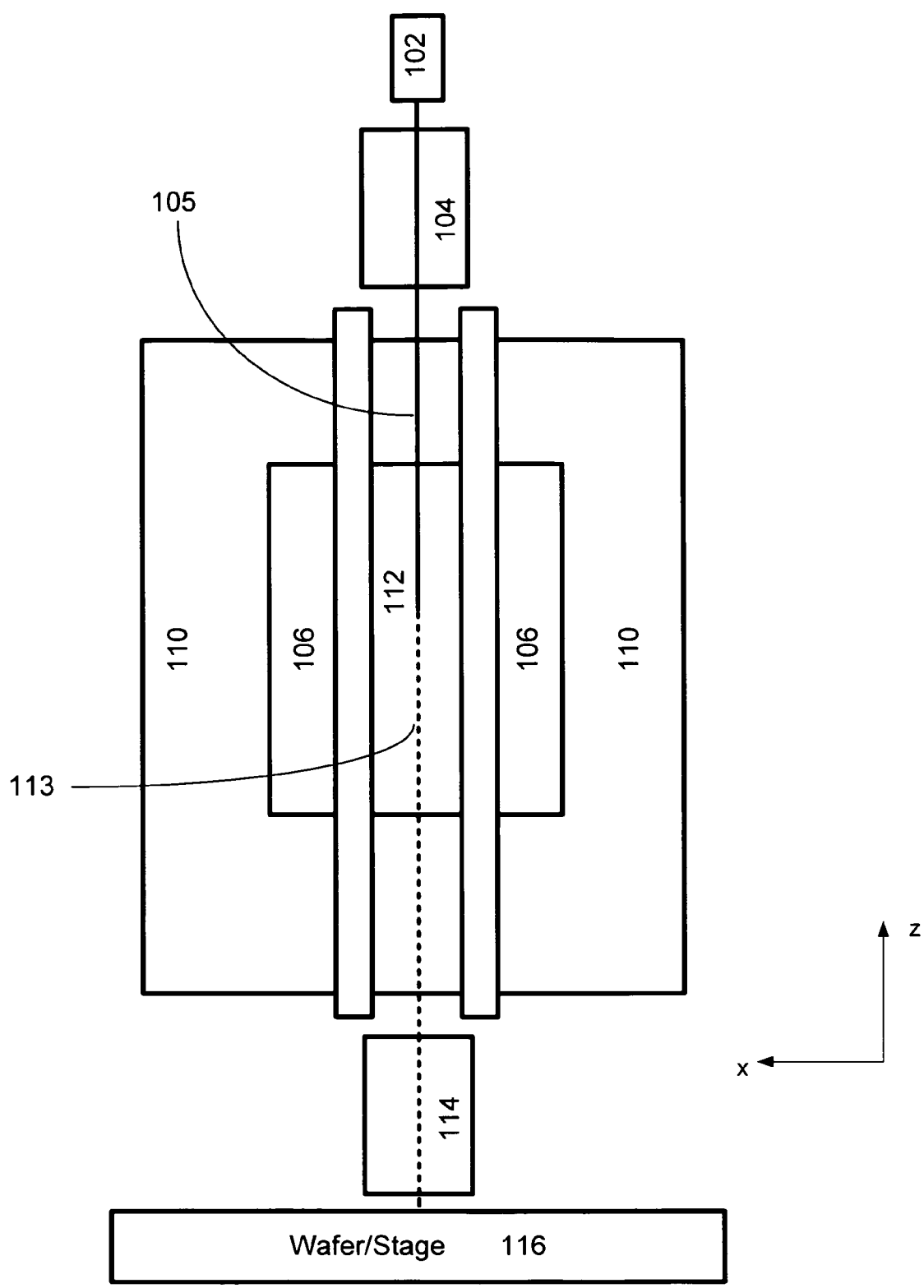

FIGS. 5A and 5B are schematic diagrams (y-z view and x-z view, respectively) of a single maskless reflection electron beam lithography column in accordance with an embodiment of the invention. FIG. 5A is a simplified illustration which corresponds to FIG. 1. Hence, the components and operation of the single REBL column in FIG. 5A is generally as described above in relation to FIG. 1.

FIG. 5B shows a perpendicular view relative to FIG. 5A. Again, the the components and operation of the single REBL column in FIG. 5B is generally as described above in relation to FIG. 1. The x-z view given in FIG. 5B is useful in understanding FIG. 6.

Figure 6:
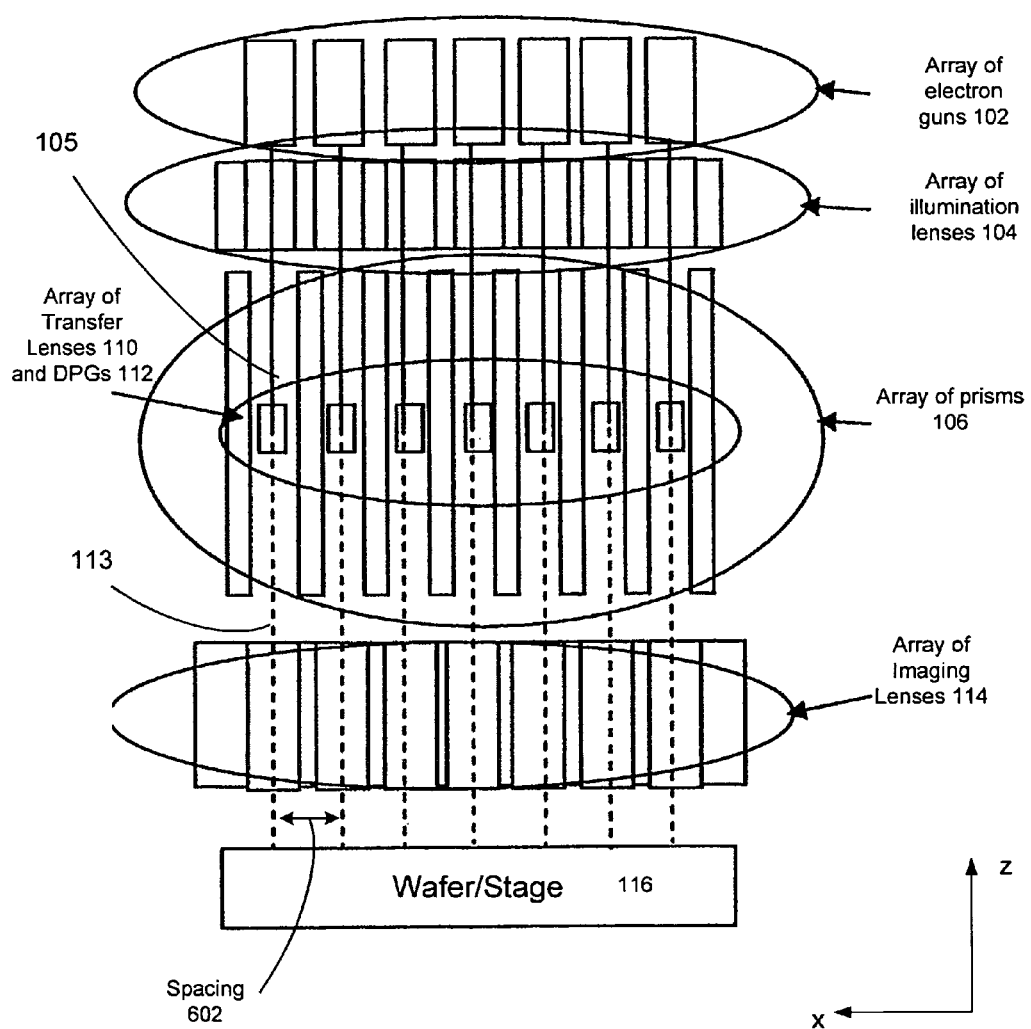
FIG. 6 is a schematic diagram (x-z view) showing a multiple column array apparatus for maskless reflection electron beam lithography in accordance with an embodiment of the invention.

FIG. 6 is a schematic diagram (x-z view) showing a multiple column array apparatus for maskless reflection electron beam lithography in accordance with an embodiment of the invention. FIG. 6 is similar to FIG. 5B, but FIG. 6 includes multiple REBL columns while FIG. 5B has only a single REBL column.

FIG. 6 depicts a linear array of REBL columns above the wafer stage 116. The linear array of REBL columns comprises a linear array of electron guns 102, a linear array of illumination lenses 104, a linear array of prisms 106, linear arrays of transfer lenses 110 and DPGs 112, and a linear array of imaging lenses 114. As seen, this linear array of REBL columns produces linear arrays of incident 105 and reflected 113 electron beams, where the reflected electron beams 113 are used to pattern the wafers on the stage 116.

In operation, each of the multiple columns may be operated independently with regards to the patterning that is written. The control systems for registering to the previous patterns, and for monitoring the position of the column and the beam within the column, are replicated and function in parallel.

In a preferred embodiment, a single REBL column may write a portion of the overall lithographic pattern in a spiral manner. In this embodiment, the columns are spaced so that each writes a portion of each wafer on the rotary stage as the stage is simultaneously rotated about its center axis (see illustrated rotation ω in FIG. 4A, for example) and linearly translated (along the x-direction in FIG. 4A, for example).

Figure 7A:
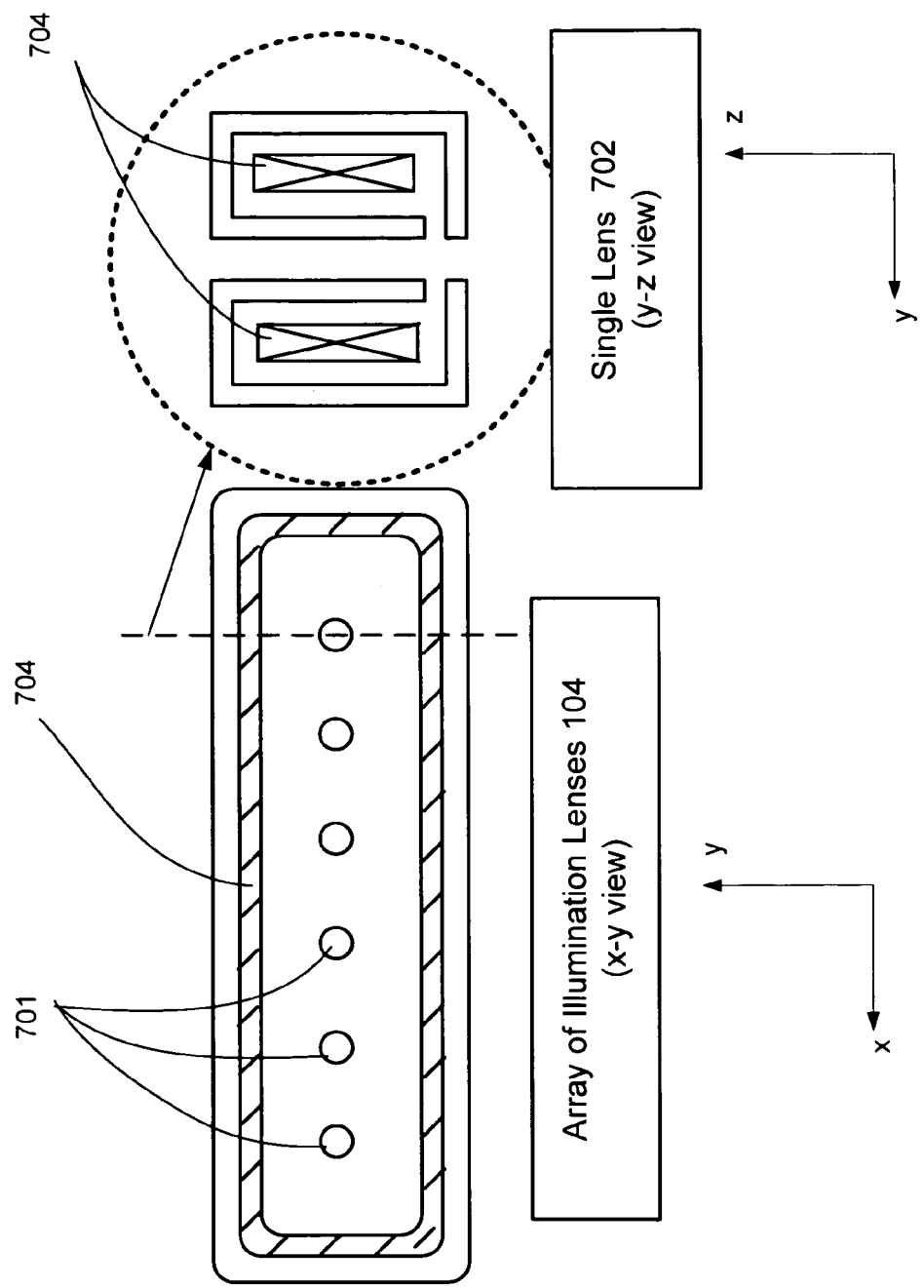
FIG. 7A depicts an example linear array of illumination lenses and a cross-section of a single lens in the array in accordance with an embodiment of the invention.
Figure 7B:
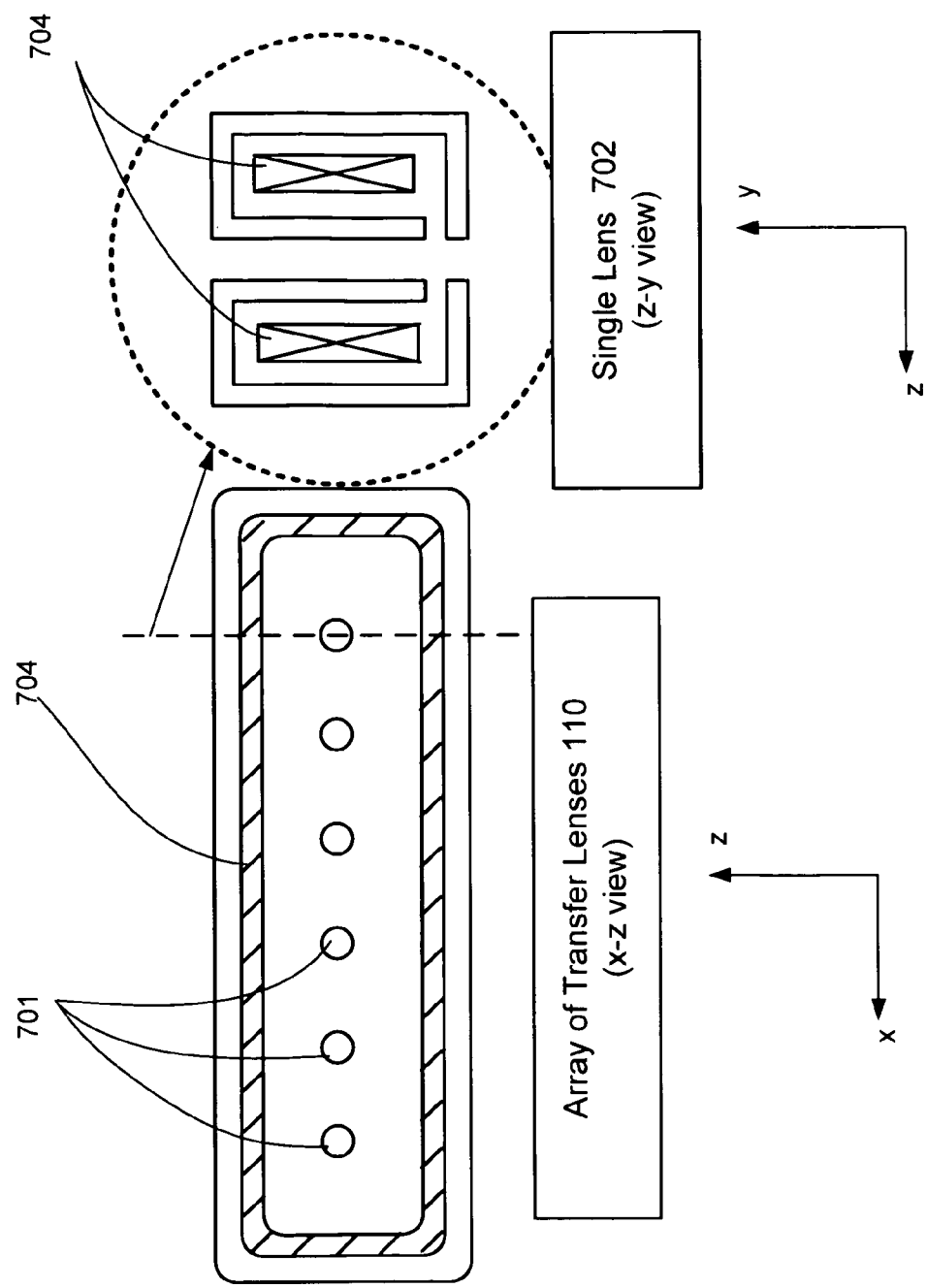
FIG. 7B depicts an example linear array of transfer lenses and a cross-section of a single lens in the array in accordance with an embodiment of the invention.

FIG. 7A depicts an example linear array of illumination lenses 104 (x-y view) and a cross-section of a single lens 702 in the array (y-z view) in accordance with an embodiment of the invention. FIG. 7B depicts an example linear array of transfer lenses 110 (x-z view) and a cross-section of a single lens 702 in the array (z-y view) in accordance with an embodiment of the invention. Finally, FIG. 7C depicts an example linear array of imaging lenses 114 (x-y view) and a cross-section of a single lens 702 in the array (y-z view) in accordance with an embodiment of the invention.

Figure 7C:
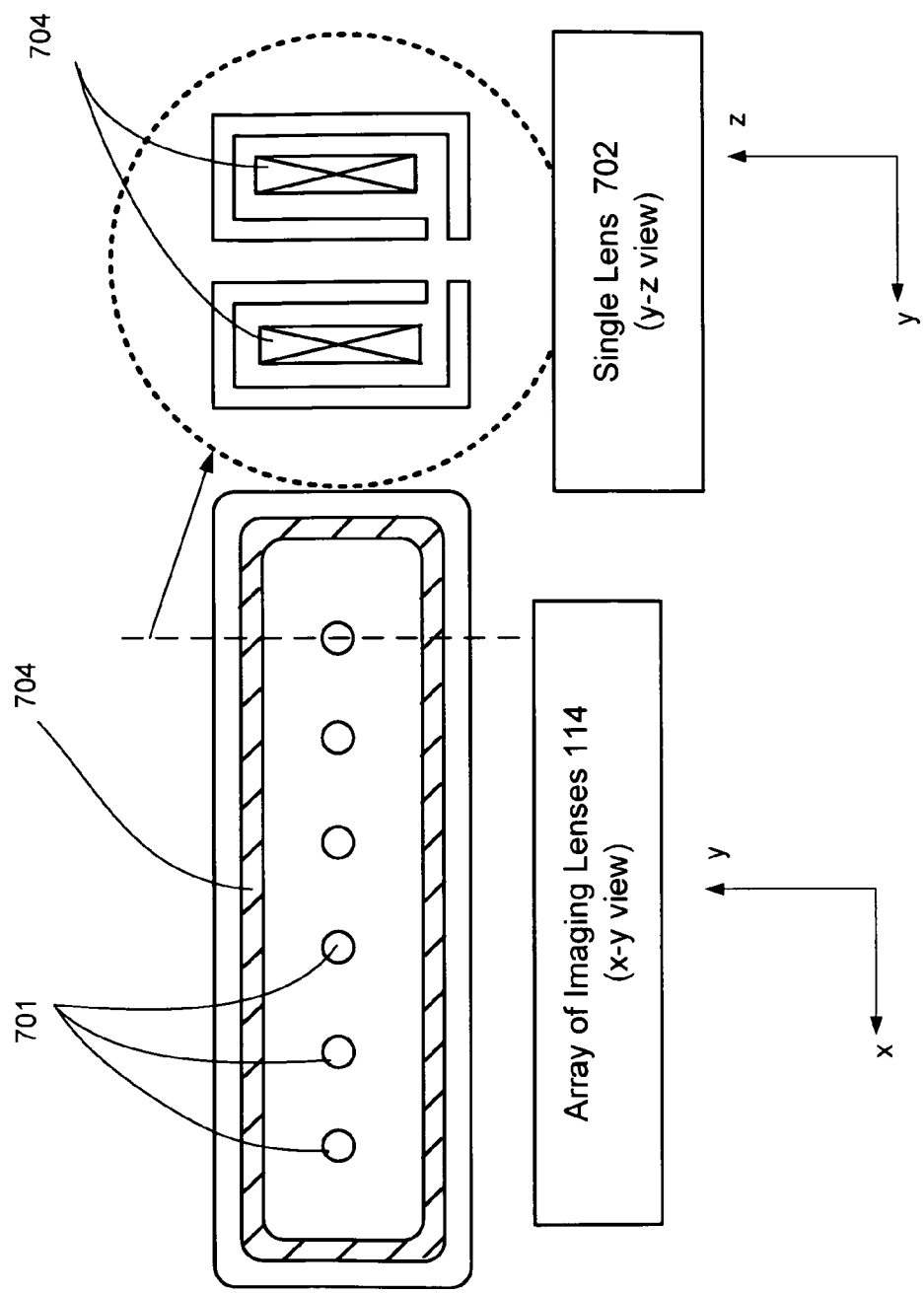
FIG. 7C depicts an example linear array of imaging lenses and a cross-section of a single lens in the array in accordance with an embodiment of the invention.

The linear arrays of FIGS. 7A, 7B and 7C may be constructed such that each individual column has an advantageously small footprint of less than 50 millimeters in diameter. As such, the center-to-center spacing between adjacent columns (see 602 in FIG. 6) may be 50 millimeters or less. The linear arrays may be constructed, for example, using a single piece of iron with a linear array of holes 701 therein. The holes act as lens elements and may be excited in a substantially uniform manner using a single coil 704.

CONCLUSION

Advantageously, using the above-disclosed apparatus and methods, throughput for an electron lithography system may be greatly increased. This is because each column can contribute an additional beam current to the writing process without the image blur of the column being influenced by the current from the other columns. The rotary/linear motion of the stage combines with the linear array of columns to provide an efficient spiral writing process. In addition, the linear array of columns avoids the difficulty of measuring each column's position within a rectangular array.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for electron beam lithography, the apparatus comprising:
    a rotary stage comprising a rotatable platen for holding a plurality of substrates of a same size spaced evenly around a center of the rotatable platen;
    a first linear array of reflection-electron beam lithography columns positioned above a first substrate held on the rotatable platen; and
    a second linear array of reflection-electron beam lithography columns positioned above a second substrate held on the rotatable platen,
    wherein the first and second linear arrays are arranged along a diameter of the rotatable platen and on opposite sides across the center of the rotatable platen.

2. The apparatus of claim 1, wherein each reflection-electron beam lithography column in the first linear array comprises:
    an electron source for generating an incident electron beam;
    a dynamic pattern generator for receiving the incident electron beam and generating a dynamically-patterned reflected electron beam;
    a magnetic prism for bending the incident electron beam towards the dynamic pattern generator and for bending the reflected electron beam towards the rotary stage;
    an illumination lens positioned between the electron source and the magnetic prism;
    a transfer lens positioned between the magnetic prism and the dynamic pattern generator; and
    an imaging lens positioned between the magnetic prism and the platen.

3. The apparatus of claim 1, wherein the first linear array comprises:
    electron sources for generating incident electron beams;
    dynamic pattern generators for receiving the incident electron beams and generating dynamically-patterned reflected electron beams;
    magnetic prisms for bending the incident electron beams towards the dynamic pattern generators and for bending the reflected electron beams towards the platen;
    an array of illumination lenses located between electron sources and the magnetic prisms in the first linear array;
    an array of transfer lenses located between the magnetic prisms and dynamic pattern generators in the first linear array; and
    an array of imaging lenses located between the magnetic prisms in the first linear array and the platen,
    wherein the array of illumination lenses, the array of transfer lenses, and the array of imaging lenses are each constructed using a single magnetic coil.

4. The apparatus of claim 1, wherein a center-to-center spacing between adjacent reflection-electron beam lithography columns in the first linear array is less than 50 millimeters.

5. A method of electron beam lithography, the method comprising:
    rotating a platen holding a plurality of wafers evenly spaced on the platen around a center region of the platen; and
    writing a lithography pattern using a first linear array of reflection electron beam lithography columns positioned over a first wafer held on the platen and a second linear array of reflection election beam lithography columns positioned over a second wafer held on the platen,
    wherein the first and second linear arrays are arranged along a diameter of the platen and on opposite sides across the center of the platen.

6. The method of claim 5, wherein each reflection electron beam lithography column generates an incident electron beam using an electron source, bends the incident electron beam towards a dynamic pattern generator using a magnetic prism, generates a dynamically-patterned reflected electron beam using the dynamic pattern generator, and bends the reflected electron beam towards the stage using the magnetic prism.

7. The method of claim 6, further comprising using an array of illumination lenses constructed using a single magnetic coil to generate the incident electron beams.

8. The method of claim 6, further comprising using an array of transfer lenses between the dynamic pattern generator and the magnetic prism.

9. The method of claim 6, further comprising using an array of imaging lenses constructed using a single magnetic coil to image the reflected electron beams onto a substrate of the first wafer.

10. The method of claim 6, wherein a center-to-center spacing between adjacent columns is less than 50 millimeters.

11. A method for writing a lithography pattern to target substrates, the method comprising:
   holding a plurality of target substrates evenly spaced around a center region of a platen; and
   writing the lithography pattern onto a first target substrate of the plurality of target substrates underneath a first linear array of electron beam columns and onto a second target substrate of the plurality of target substrates underneath a second linear array of electron beam columns,
   wherein the first and second linear arrays are arranged along a diameter of the platen and on opposite sides across the center of the platen.

* * * * *